(12) United States Patent
Mayampurath et al.

(10) Patent No.: US 7,305,190 B2
(45) Date of Patent: Dec. 4, 2007

(54) OPTICAL DISPERSION CORRECTION IN TRANSIMPEDANCE AMPLIFIERS

(75) Inventors: Balagopal Mayampurath, Camarillo, CA (US); Byung-Jong Moon, Thousand Oaks, CA (US); Allan Chan, Camarillo, CA (US); Bruce Massey, Camarillo, CA (US)

(73) Assignee: Vitesse Semiconductor Corporation, Camarillo, CA (US)

( * ) Notice: Subject to any disclaimer, the term of this patent is extended or adjusted under 35 U.S.C. 154(b) by 498 days.

(21) Appl. No.: 10/841,948

(22) Filed: May 6, 2004

(65) Prior Publication Data

US 2005/0062543 A1 Mar. 24, 2005

Related U.S. Application Data

(60) Provisional application No. 60/468,472, filed on May 6, 2003.

(51) Int. Cl.
*H04B 10/08* (2006.01)
*H04B 10/06* (2006.01)

(52) U.S. Cl. ............... 398/202; 398/209; 398/213; 398/37

(58) Field of Classification Search ............ 398/33, 398/37, 202, 206, 209, 210, 213; 330/11, 330/59, 308, 284; 250/214 C, 214 A, 214 AG
See application file for complete search history.

(56) References Cited

U.S. PATENT DOCUMENTS 3,636,463 A 1/1972 Ongkiehong
4,092,611 A 5/1978 Frederiksen et al.
4,388,732 A * 6/1983 Hansel ................. 398/23
4,415,803 A 11/1983 Muoi
4,455,535 A 6/1984 Sugawara
4,540,953 A 9/1985 Togari et al.
4,563,656 A 1/1986 Baum
4,565,974 A 1/1986 Smoot
4,574,249 A 3/1986 Williams
4,608,542 A 8/1986 Siegel
4,642,453 A 2/1987 Nordqvist et al.
4,714,828 A 12/1987 Bacou et al.
4,764,732 A 8/1988 Dion
4,855,687 A 8/1989 Hebert Raymond T.
5,008,524 A 4/1991 Reutter et al.
5,012,202 A 4/1991 Taylor
5,343,160 A 8/1994 Taylor
5,602,510 A 2/1997 Bayruns et al.
5,812,030 A 9/1998 Inami et al.
6,084,478 A 7/2000 Mayampurath
6,218,905 B1 4/2001 Sanders et al.
6,528,777 B2 * 3/2003 Ames et al. ............ 250/214 R
6,713,749 B2 3/2004 Wu et al.

OTHER PUBLICATIONS

Palojärvi, et al., "A Variable Gain Transimpedance Amplifier Channel With A Timing Discriminator For A Time-Of-Flight Laser Radar", Proceedings of the 23nd European Solid-State Circuits Conference, Southampton, UK, Sep. 16-18, 1997 (4 pgs.).

* cited by examiner

*Primary Examiner*—Dalzid Singh
(74) *Attorney, Agent, or Firm*—Christie, Parker & Hale, LLP

(57) ABSTRACT

A transimpedance amplifier having adjustment for optical distortion in an optical communication link. The transimpedance amplifier comprises a transimpedance stage and a post amplifier stage, which has a feedback path including an optical distortion adjustment circuit.

7 Claims, 12 Drawing Sheets

Negative V-offset

Positive V-offset

Positive/Negative V-offset application with automatic optical distortion adjustment application with manual optical distortion adjustment Fiber Dispersion (Single Ended)

Amplified Optical System (Single Ended)

ated figures.
OPTICAL DISPERSION CORRECTION IN TRANSIMPEDANCE AMPLIFIERS

CROSS-REFERENCE TO RELATED APPLICATION(S)

This application claims the benefit of U.S. Provisional Patent Application No. 60/468,472, filed on May 6, 2003, the disclosure of which is incorporated herein by reference.

BACKGROUND OF THE INVENTION

The present invention generally relates to optical data communications and more particularly to optical dispersion correction in transimpedance amplifiers.

Optical data networks provide tremendous amount of data from one point or points to another point or points. However, optical data traveling through long reaches of optical fiber often undergoes various types of distortion. In one instance, the duty-cycle of the data pulses changes. Distortion is also introduced by communication components such as Erbium Doped Fiber Amplifiers (EDFA) that boost optical signals. In particular, the EDFAs add more noise to a logical one level of an optical pulse. As such, an altered duty cycle and a noisier logical one level may lead to lower sensitivity in an optical link.

Switching threshold adjustments may be made to help counter optical distortion. One example of adjusting the switching threshold involves adjusting the DC switching threshold of a final output buffer in a transimpedance amplifier (TIA), namely after current to voltage conversion and subsequent amplification through gain stages. However, a large input signal into the TIA may drive the gain stages, following the I-to-V stage of the TIA, into saturation. Thus, any adjustment to the switching threshold would be performed on a saturated signal. This is generally not desired, since some of the equalization algorithms applied to the data downstream may require that the circuitry be operated in the linear range. Also, since the threshold adjustment may be performed on the output buffer, the TIA may have to be DC-coupled to the post-amplifier to make a threshold adjustment.

SUMMARY OF THE INVENTION

Aspects of the invention generally provide methods and devices for correcting optical distortions in an optical communication link, and in various aspects, improving sensitivity of the link. In some aspects, the invention provides methods and devices of modifying the switching threshold directly after the transimpedance function. In some other aspects, the invention provides methods and devices of implementing differential adjustment of switching threshold immediately after the transimpedance function.

One aspect of the invention provides a transimpedance amplifier having adjustment for optical distortion. The transimpedance amplifier comprises a transimpedance stage and a post amplifier stage coupled to the transimpedance stage. The post amplifier stage comprises a plurality of post amplifiers coupled in series. The post amplifier stage has a feedback path including an optical distortion adjustment circuit.

Another aspect of the invention provides a method of adjusting optical distortions in a transimpedance amplifier. The method comprises providing a transimpedance stage and modifying a switching threshold directly after the transimpedance stage.

These and other aspects of the invention are more fully appreciated upon review of this disclosure including the associated figures.

BRIEF DESCRIPTION OF THE DRAWINGS

In the drawings, like reference characters generally refer to the same parts throughout the different drawings.

DETAILED DESCRIPTION

Figure 1:
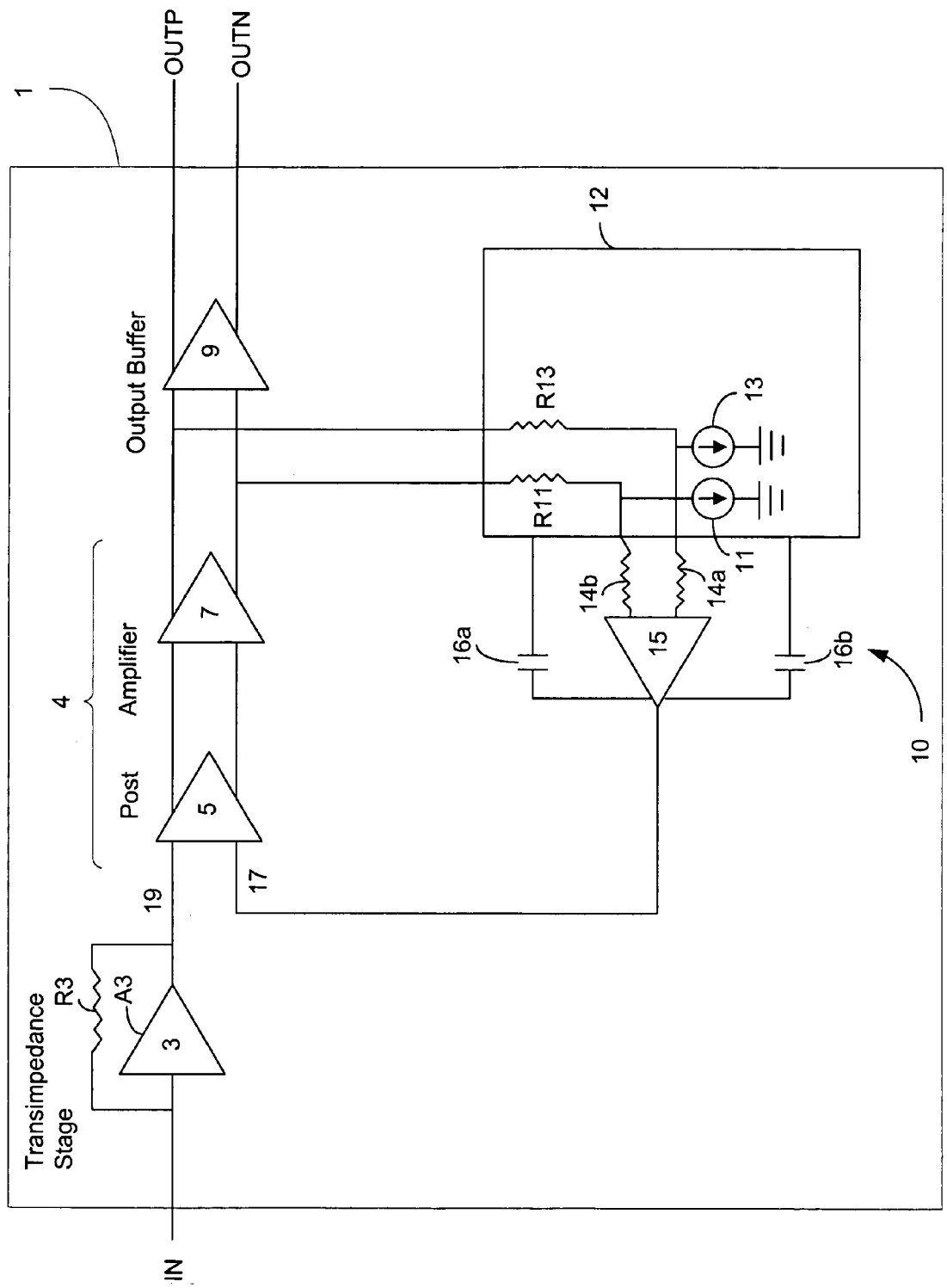
FIG. 1 illustrates a block diagram of an embodiment of transimpedance amplifier with an optical distortion adjustment circuit constructed in accordance with aspects of the invention.

FIG. 1 illustrates a block diagram of an embodiment of a transimpedance amplifier with an optical distortion adjustment circuit in accordance with aspects of the invention. A transimpedance stage 3 receives a current signal from a photodetector (not shown), such as a photodiode. The photodetector detects an incoming optical signal. The photodetector is, for example, in a receiver in an optical communication network. Examples of optical communication networks include, but are not limited to, SONET OC-192, SDH STM-64 and 10G Ethernet fiber links.

The photodetector generates a current based on received optical energy. A transimpedance stage 3 receives a current signal from the photodetector. The transimpedance stage includes an amplifier or a buffer A3 with a feedback resistor R3. The feedback resistor and the amplifier converts the current to voltage and amplifies the voltage, with a typical gain of 500.

An output of the transimpedance stage 3 is coupled to a post amplifier stage 4. As illustrated, the post amplifier stage includes a series of amplifiers, with a first post amplifier 5 and a second post amplifier 7 coupled in series. As illustrated, the post amplifiers 5 and 7 are serially coupled. The first post amplifier 5 converts the single-ended output of the transimpedance stage 3 to a differential signal. The differential outputs of the post amplifier 5 are coupled to the inputs of the second post amplifier 7. The differential outputs of the second post amplifier 7 are coupled to the inputs of the output buffer 9, which in one embodiment provides a 50 ohm interface to the differential outputs, OUTP and OUTN, of the transimpedance amplifier 1.

Feedback is provided from the output of the second post amplifier 7 to an input 17 of the first post amplifier 5. The feedback provides optical distortion adjustment via an optical distortion adjustment circuit 10 in the feedback path. The optical distortion adjustment circuit 10 adjusts for optical distortion by modifying a switching threshold for the first post amplifier 5.

In one embodiment, the adjustment circuit 10 comprises a differential voltage balance circuit 12 comprising current sources 11 and 13 and resistors R11 and R13. One end of resistor R11 is coupled to one of the differential outputs of the post amplifier 7, and one end of resistor R13 is coupled to the other different output of the post amplifier 17. The other ends of resistors R11 and R13 are coupled to current sources 11 and 13, respectively.

The adjustment circuit also comprises a feedback buffer 15 receiving differential inputs from nodes between the resistor R11 and R13 and the current courses 11 and 13, respectively. In the example of FIG. 1, resistors 14a and 14b are interposed between the differential outputs of the balance circuit 12 and the inputs to the feedback buffer 15. Moreover, capacitors 15a and 16b provide feedback path from the inputs of the buffer 15 to the single-ended output of the buffer 15. The feedback buffer 15 converts the different inputs into a single-ended output, balanced between the two inputs to the feedback buffer, which is received by the input 17 of the first post amplifier 5.

The switching threshold of the post amplifier 5 is based on the input provided by the feedback buffer. The switching threshold is adjusted by varying the current sources 11 and 13 of the adjustment circuit 10. Each current source is programmable. In some embodiments, the variable current sources are off-chip units controlled by a digital to analog converters. In some embodiments, the variable current sources are controlled by downstream units, such as clock and data recovery units (CDRs) or bit error rate mappers (BER units).

In some embodiments, the circuit 10 balances the differential outputs of the post amplifier 7 by varying the current levels using the current sources 11 and 13. When the differential output signals are balanced, the switching threshold to the input 17 equals the average value of the AC signal at the other input 19 of the first post amplifier stage 5. However, when the differential output signal are not balanced, the switching threshold is offset from the average value of the AC input 19 to the first post amplifier stage 5. In that case, the feedback path continues to modify the switching threshold until the offset is minimized.

In various embodiments, the transimpedance amplifier 1 modifies the switching threshold immediately and directly after the transimpedance function, where the data often has a small amplitude which allows the amplifier to operate in the linear region. Also, immediately after the transimpedance function, the input signal is in the range that effectively utilizes the linear range of the amplifier circuit 1. Moreover, the adjustment of the switching threshold performed directly after the transimpedance function allows finer granularity in adjusting the threshold than the adjustment performed after the post amplification stage.

Furthermore, the transimpedance amplifier circuit 1 can operate in both DC-coupled and AC-coupled modes to a clock and data recovery (CDR) circuit or a post-amplifier, since there are multiple gain stages on-chip after the threshold adjustment. Moreover, because the threshold adjustment is performed directly after the transimpedance function, noise coupling into the sensitive front-end of the transimpedance amplifier is minimized. The differential implementation of the threshold adjustment translates any noise coupled into the chip to be largely common-mode noise. Since the common-mode gain of the op-amps used in the transimpedance amplifier circuit 1 is substantially low, the common-mode noise is largely rejected.

Figure 2:
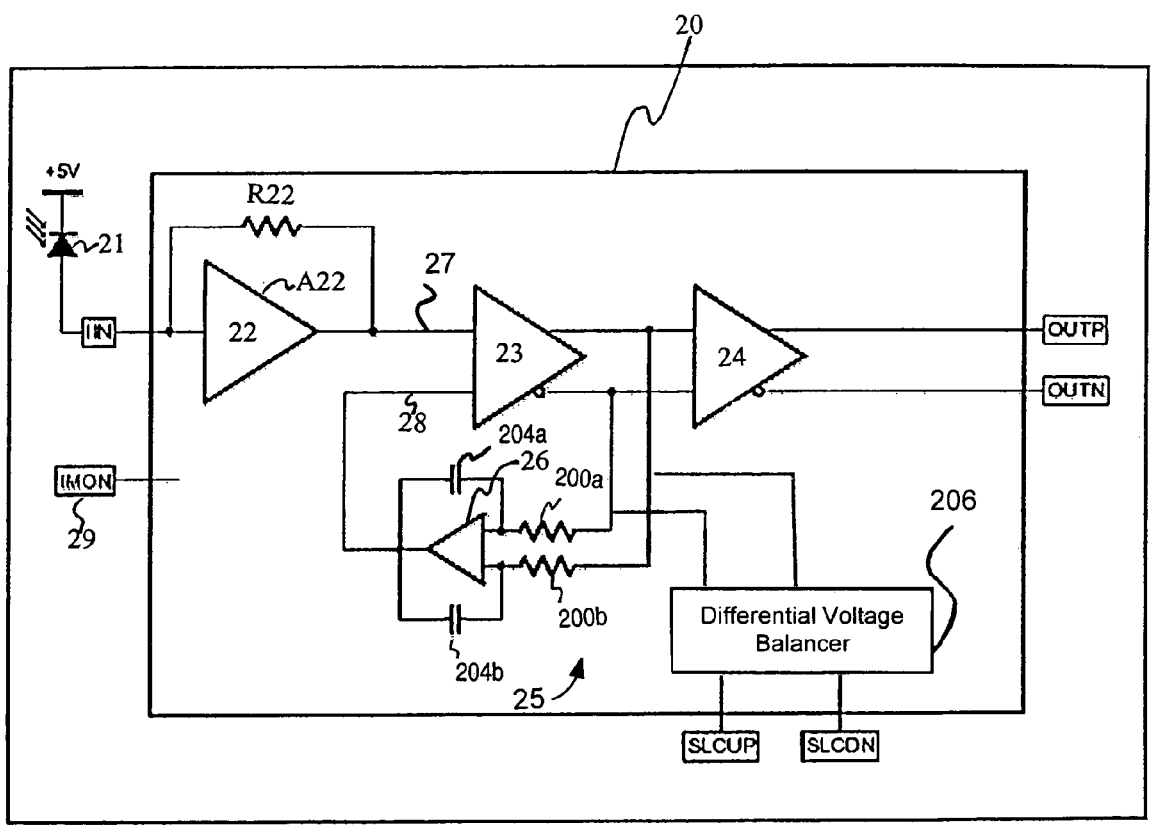
FIG. 2 illustrates a block diagram of an alternative embodiment of transimpedance amplifier with an optical distortion adjustment circuit constructed in accordance with aspects of the invention.

FIG. 2 illustrates a block diagram of an alternative embodiment of transimpedance amplifier with an optical distortion adjustment circuit constructed in accordance with aspects of the invention. A transimpedance stage 22 receives a current signal from a photodetector. A photodetector, such as a photodiode 21, in a receiver in optical communication networks detects the incoming optical signals. Examples of the optical communication networks include, but are not limited to, SONET OC-192, SDH STM-64 and 10G Ethernet fiber links. The photodetector generate a current signal based on the received optical energy. The transimpedance stage 22 receives the current signal, up to 2 mA in some embodiments, from the photodiode via an IIN input pin. The transimpedance stage 22 includes an amplifier A22 with a feedback resistor R22. The feedback resistor R22 and the amplifier converts the current signal to a voltage signal and amplifies the voltage, with a typical gain of 500.

An output of the transimpedance stage 22 is a post amplifier stage. As illustrated, the post amplifier stage includes a limiting amplifier 23. The limiting amplifier 23 converts the single-ended signal to a differential signal with a typical gain of 10. In some embodiments, a DC restoration circuit is used in the limiting amplifier 23 to remove the signals' DC component.

The differential outputs of the limiting amplifier 23 is coupled to an output buffer 24, typically having a gain of 2. The buffer 24 sets the data output OUTP to HIGH and its complementary output OUTN to LOW when light is applied to the external photodetector 21. For high input current levels, typically not exceeding 2 mA, the corresponding outputs OUTP and OUTN are typically limited to 600 mVp-p differential signals. In some embodiments, the output buffer 24 has a gain of 2 and is capable of driving a 50 single-ended load which can be either AC-coupled or DC-coupled.

The post amplifier stage also includes a feedback path between the differential outputs of the limiting amplifier 23 and an input 28 of the limiting amplifier 23. This feedback path includes an optical distortion adjustment circuit, which adjusts optical distortion by modifying a switching threshold for the limiting amplifier 23. The optical distortion adjustment circuit 25 comprises a differential voltage balance circuit 206 and a feedback buffer 26.

In one embodiment, the differential voltage balance circuit 206 of FIG. 2 is the differential voltage balance circuit 12 of FIG. 1. In FIG. 2, in one embodiment, the circuit 25 is controlled by varying the current through external control pads, SLCUP and SLCDN. The current can be varied by connecting resistors to SLCUP and/or SLCDN. Examples of various applications of the SLCUP and SLCDN pads will be provided in the discussion of FIGS. 4-10.

The compensated signal that has been balanced by the SLCUP and SLCDN pins are received by the feedback buffer 26. In the example of FIG. 2, resistors 200a and 200b are interposed between the differential outputs of the balance circuit 206 and the inputs to the feedback buffer 26. Moreover, capacitors 204a and 204b provide feedback paths from the inputs of the buffer 26 to the single-ended output of the buffer 26. The feedback buffer converts the differential input signals into a single-ended output threshold voltage. The threshold voltage in then provided to the input 28 of the limiting amplifier 23.

An IMON output pin 29 is used for fiber alignment of the photodiode 21 during assembly. In one implementation, the IMON output pin 29 provides a current signal proportional to the average input current of the transimpedance amplifier 20.

Figure 3:
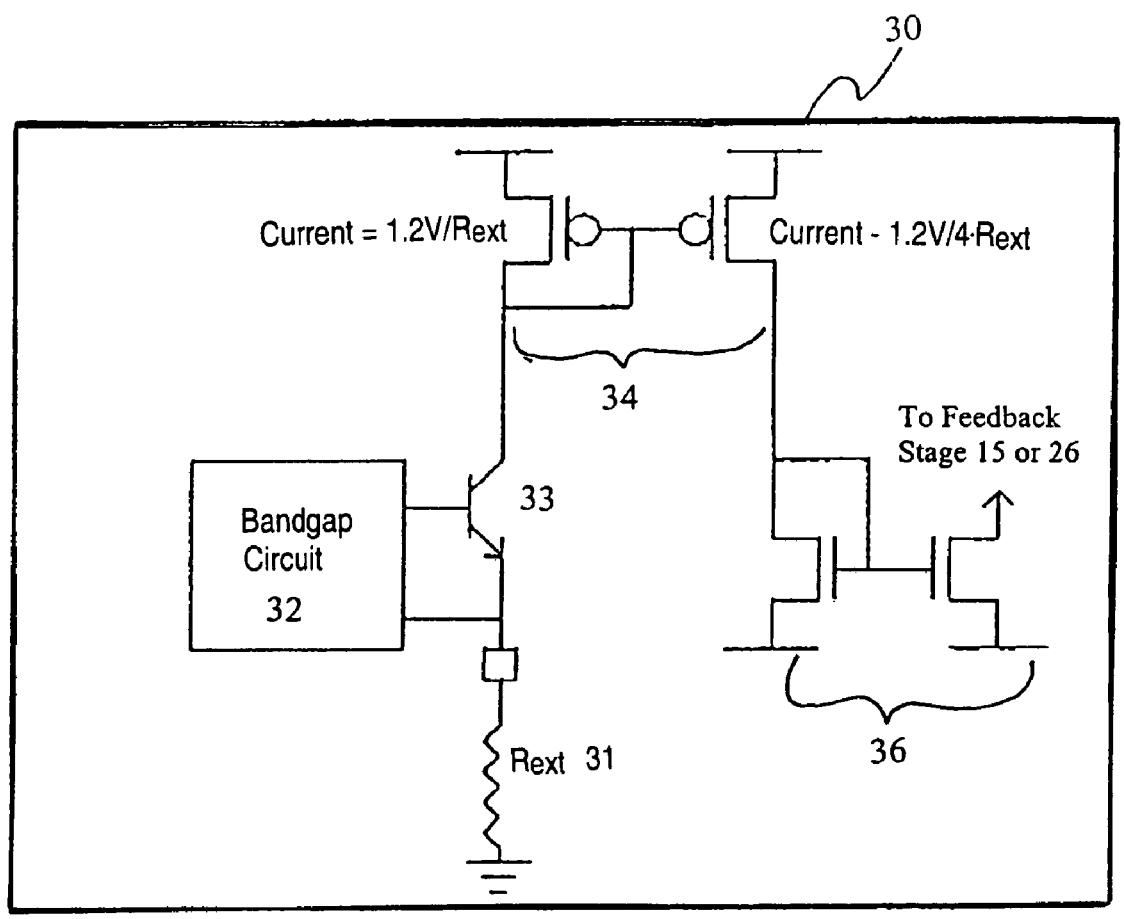
FIG. 3 illustrates a block diagram of an embodiment of a current source in the optical distortion adjustment circuit of FIGS. 1 and 2.

FIG. 3 illustrates a block diagram of one embodiment of a variable current source denoted as a current source 11, 13 in FIG. 1 or in the optical digital distortion adjustment circuit of FIG. 2. A current source 30 comprises an off chip resistor $R_{ext}$ 31 coupled to a bandgap circuit 32. A transistor 33 couples the $R_{ext}$ 31, the bandgap circuit 32 and a current mirror 34. The mirrored current from the current mirror 34 drives a further current mirror 36 coupled to the feedback path of FIGS. 1 and 2.

The current source 30 is programmable using an off-chip resistor $R_{ext}$ 31. The off-chip resistor, in various embodiments, is a variable resistor, an array of selectable resistors, or other device.

The bandgap circuit 32 sets a pin on the chip to 1.2 V. A Bandgap circuit is well known and is useful in that the circuit produces a voltage to a first order, temperature and supply independent and approximately equal to the silicon bandgap voltage of 1.2V. As $R_{ext}$ is coupled to ground and the bandgap circuit 32 sets the pin voltage to 1.2 V, the current through $R_{ext}$, and therefore the current flowing through the current source is set to $1.2V/R_{ext}$.

In the embodiment of FIG. 3, the transistor 33 is a NMOS transistor. The gate of the transistor is coupled to the bandgap circuit 32. The source of the transistor is coupled to the bandgap circuit 32 and $R_{ext}$ 31. The drain of the transistor is coupled to the current mirror 34, setting the current of the current mirror 34 to $1.2V/R_{ext}$.

In the embodiment of FIG. 3, the current mirror scales current by a factor of 4, such that the mirrored current is ¼ of $1.2V/R_{ext}$. The mirrored current drives the further current mirror 36 coupled to the feedback loop stage, for example the feedback stage 15 of FIG. 1 and the feedback stage 26 of FIG. 2. The current mirror isolates the on-chip circuitry and allows for scaling.

Figure 4:
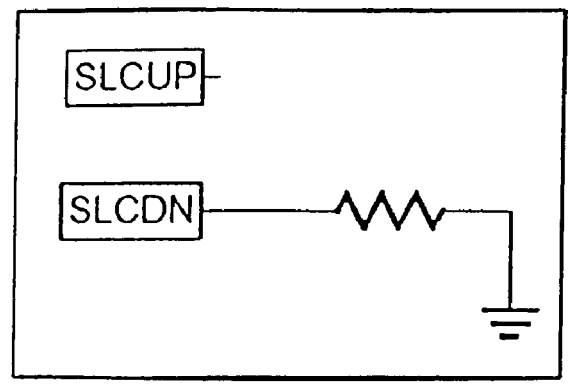
FIGS. 4-6 illustrate various embodiments of controlling the optical distortion adjustment circuit of FIG. 2.
Figure 5:
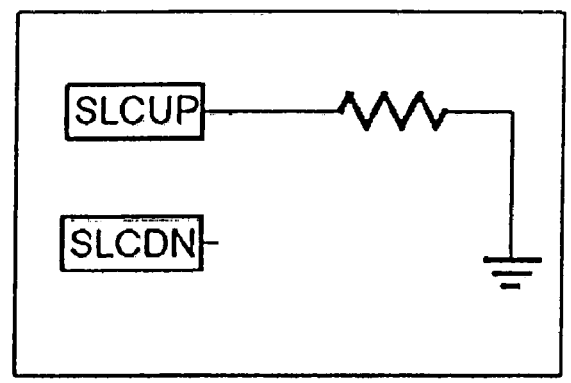
Figure 6:
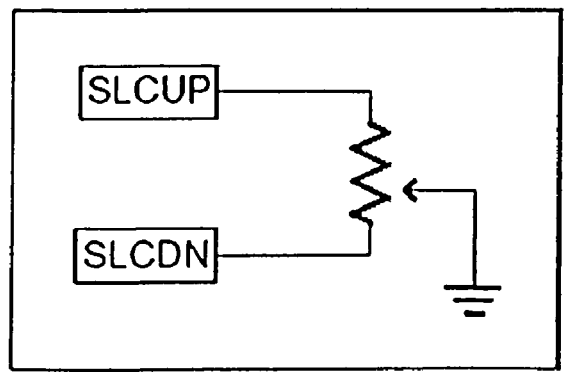

FIGS. 4-6 illustrate various embodiments of controlling the optical distortion adjustment circuit via the control pads SLCUP and SLCDN of FIG. 2. As previously mentioned in the discussion of FIG. 2, in some embodiments, the distortion adjustment circuit 25 of FIG. 2 can be controlled by varying the current through the SLCUP and/or SLCDN pads. The current can be varied by connecting resistors to the SLCUP and/or SLCDN pads. Adjustments in a single direction can be achieved by connecting one resistor to either the SLCUP or SLCDN pads. FIG. 4 illustrates coupling a resistor to the SLCDN pad to provide a negative offset voltage to pull down the current level of the distortion adjustment circuit 25. FIG. 5 illustrates coupling a resistor the SLCUP pad to provide a positive offset voltage to pull up the current level of the distortion adjustment circuit 25. Adjustments in both directions can be achieved by coupling a potentiometer to the both pads. FIG. 6 illustrates a potentiometer coupled to both SLCUP and SLCDN pads to provide the desired level of offset voltage, which translates into the desired level of current in both positive and negative directions.

Figure 7:
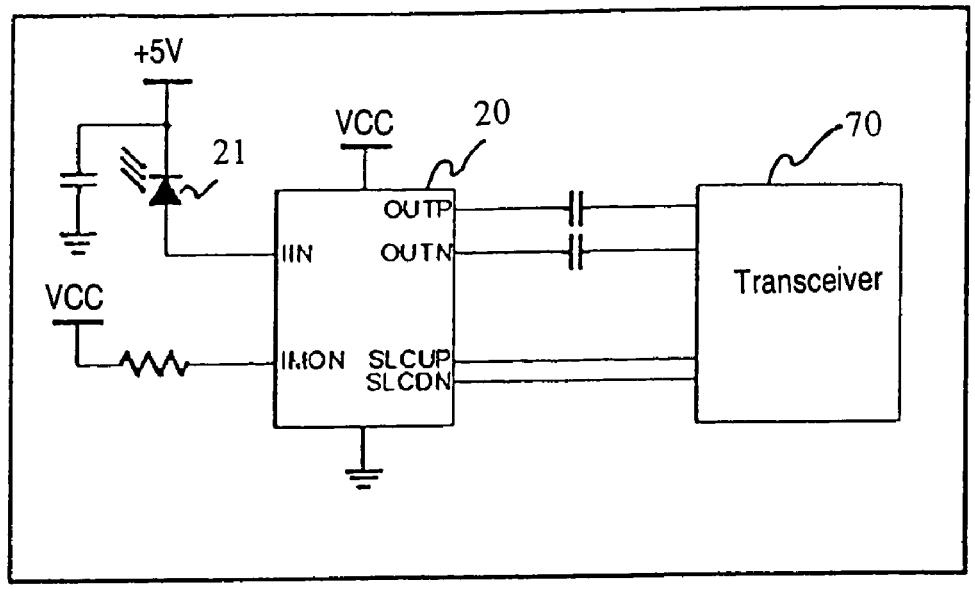
FIG. 7 illustrates an application of a transimpedance amplifier with an automatic optical distortion adjustment circuitry constructed in accordance with aspects of the invention.

FIG. 7 illustrates an application of a transimpedance amplifier with an automatic optical distortion adjustment circuitry. Referring to FIGS. 2 and 7, the transimpedance amplifier chip 20 of FIG. 2 receives comprises pins or pads IIN, IMON, OUTP, OUTN, SLCUP, and SLCDN. An IIN input pin receives the input current signal from the photodiode 21. An IMON output pin is used for fiber alignment of the photodiode 21 during assembly. In one implementation, the IMON output pin a current signal proportional to the average input current of the transimpedance amplifier 20. OUTP and OUTN output pins provide the amplified voltage signal to a transceiver 70. Based on the output signals OUTP and OUTN received, a transceiver 70 forwards a selected level of resistance to SLCUP and SLCDN pins, which in turn vary the current level of the optical distortion adjustment circuit 25. In some embodiments, the transceiver 70 comprises a potentiometer coupled to both SLCUP and SLCDN pins as depicted in FIG. 6. In these embodiments, the potentiometer is automatically controlled by the transceiver 70 based on the output signals received from the OUTP and OUTN pins.

Figure 8:
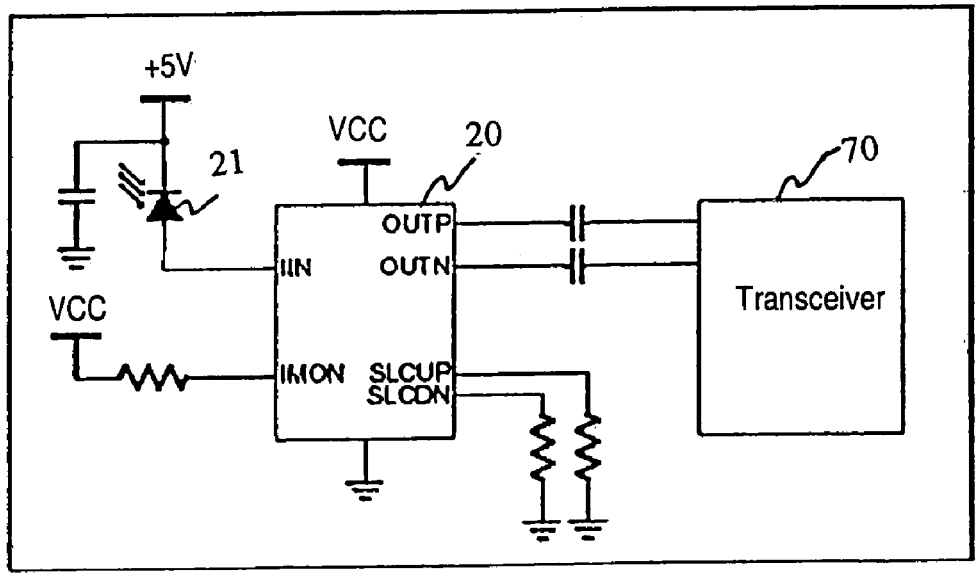
FIG. 8 illustrates application of a transimpedance amplifier with a manual optical distortion adjustment circuitry constructed in accordance with aspects of the invention.

FIG. 8 illustrates application of a transimpedance amplifier with a manual optical distortion adjustment circuitry constructed in accordance with aspects of the invention. Although similar to FIG. 7, in the transimpedance amplifier chip 20 of FIG. 8, the SLCUP and SLCDN pins are not controlled by the transceiver. As illustrated in FIGS. 4 and 5, the SLCUP pin is connected to a resistor and the SLCDN pin is connected to a different resistor, rather than to a potentiometer controlled by the transceiver 70.

Figure 9:
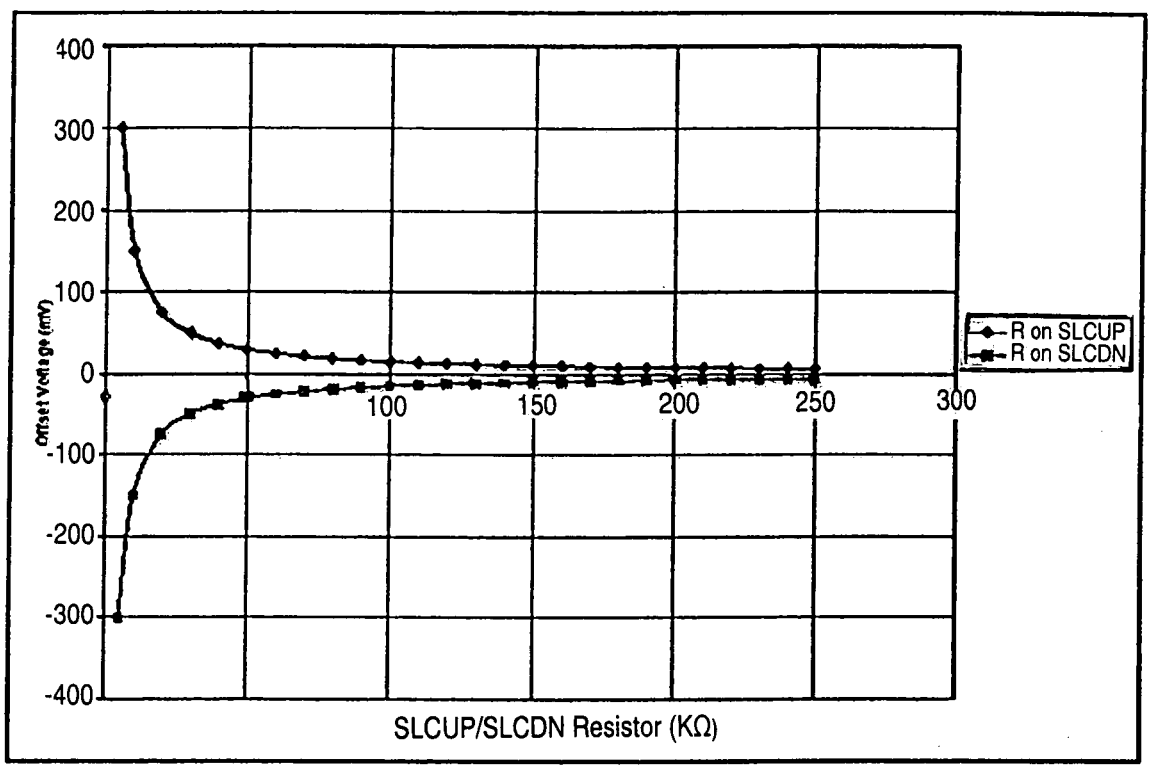
FIG. 9 illustrates the characteristics of the output offset voltage of the transimpedance amplifier of FIG. 2 with respect to various resistor values applied to the optical distortion adjustment circuit.

FIG. 9 illustrates the characteristics of the output offset voltage of the transimpedance amplifier of FIG. 2 with respect to various resistor values applied to the optical distortion adjustment circuit 25. The "Output Offset Voltage" in this example is defined as the DC voltage difference between the output signals OUTP and OUTN, also can be expressed as Output Offset Voltage=OUTP–OUTN. As illustrates in the plot of FIG. 9, the output offset voltage difference is substantially greater when the SLCUP and SLCDN pins are not provided with any resistance. The offset voltage difference reduces to near zero as the resistance applied to the SLCUP and SLCDN pins increases. For example, when the resistance of 250 KOhm is applied to each SLCUP and SLCDN pin, the offset voltage difference is substantially close to zero.

Figure 10:
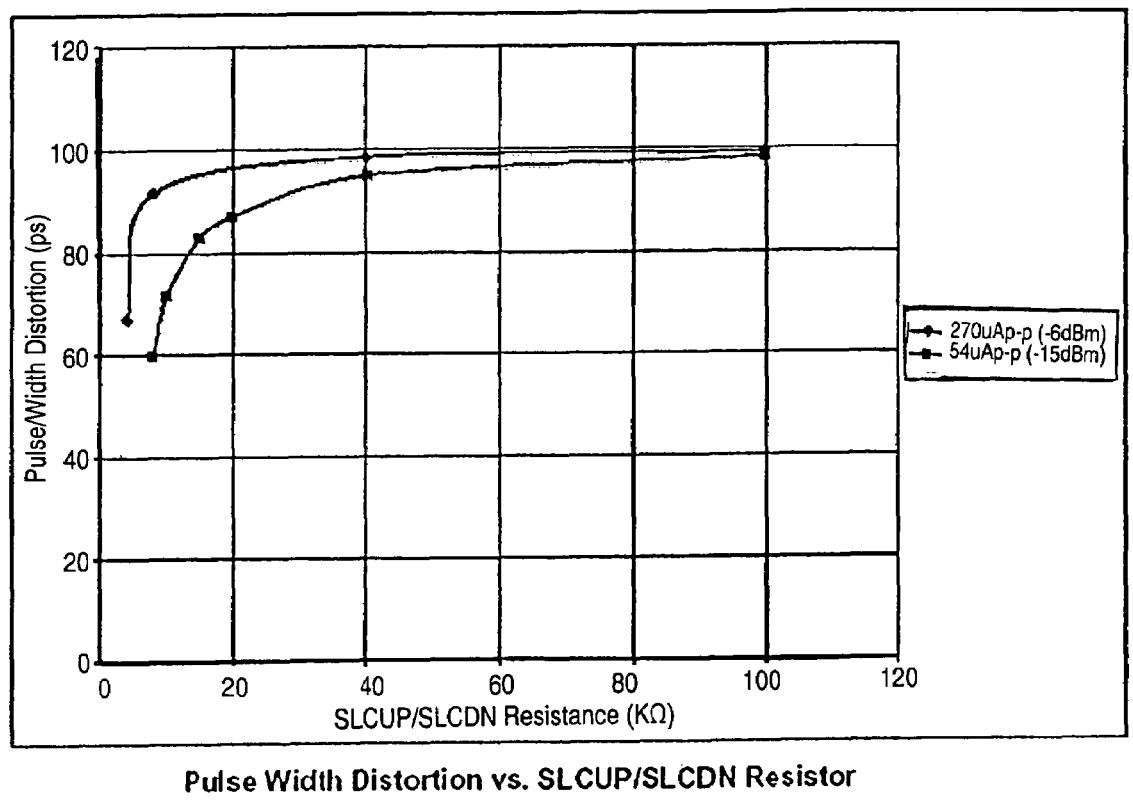
FIG. 10 illustrates the characteristics of the pulse width distortion of the incoming signals with respect to various resistor values applied to the optical distortion adjustment circuit of FIG. 2.

FIG. 10 illustrates the characteristics of the pulse width distortion of the incoming signals with respect to various resistor values applied to the optical distortion adjustment circuit of FIG. 2. FIG. 10 illustrates the characteristics of two incoming signals, one signal at 270 uAp-p and the other signal at 540 uAp-p. For the signal at 270 uAp-p, the pulse width distortion is non-linear with smaller resistance values applied to SLCUP and SLCDN pins of the distortion adjustment circuit 25 of FIG. 2. For example, as shown in FIG. 10, the pulse width distortion is substantially linear when the resistance of SLCUP/SLCDN is from 40 KOhms to 100 KOhms. Similarly, for the input signal at 540 uAp-p, the pulse width distortion is non-linear until the SLCUP/SLCDN resistor is in the range of 40 KOhms to 100 KOhms.

Figure 11:
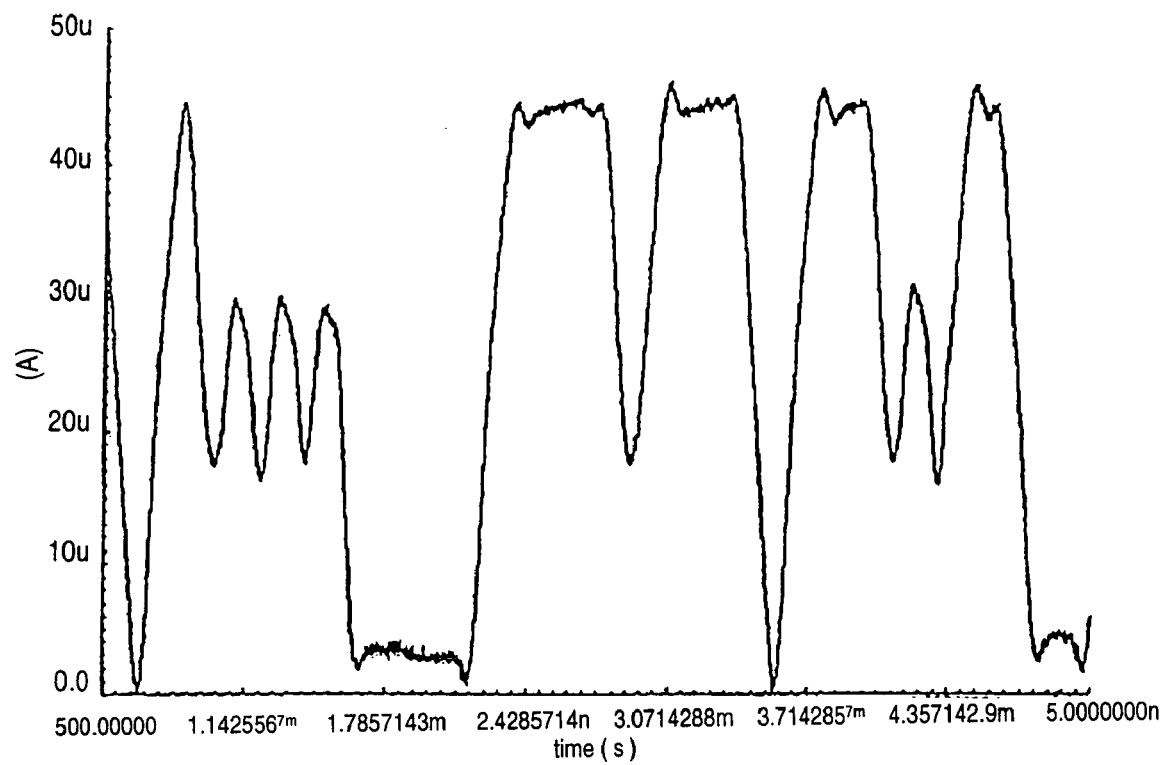
FIG. 11 illustrates an example of a waveform of current input to the transimpedance amplifier of FIGS. 1 and 2.

FIG. 11 illustrates an example of a waveform of the input current signal to the transimpedance amplifier of FIG. 1 or 2. In FIG. 11, OC 192 (9.953 Gb/s) optical data is generated from an externally modulated laser and passed through 75 Km of a single mode fiber. The optical data is converted to an electrical signal using a photodiode coupled to the transimpedance amplifier of FIG. 1 or 2. The optical data is scaled to an equivalent current signal with a range of 0 uA to 50 uA as depicted in FIG. 11 and provided as an input to the transimpedance amplifier.

Figure 12:
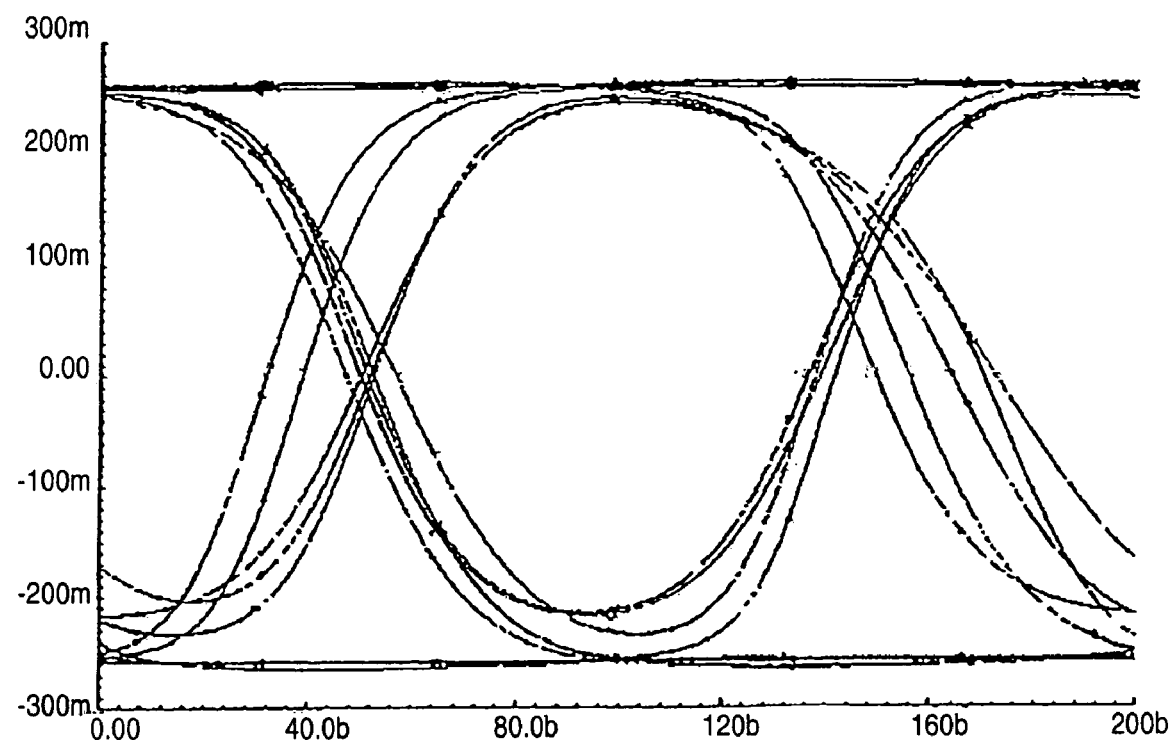
FIG. 12 illustrates an example of a waveform of a signal that has been amplified using a transimpedance amplifier without optical distortion adjustment.

FIG. 12 illustrates an example of a waveform of a signal that has been amplified using a transimpedance amplifier without optical distortion adjustment. In FIG. 4, no distortion adjustment, thus no threshold adjustment was performed to compensate for the duty-cycle distortion and other dispersive effects fro the fiber. The data output from the amplifier shows considerable amount of jitter at the two zero crossings, denoted with dotted lines.

Figure 13:
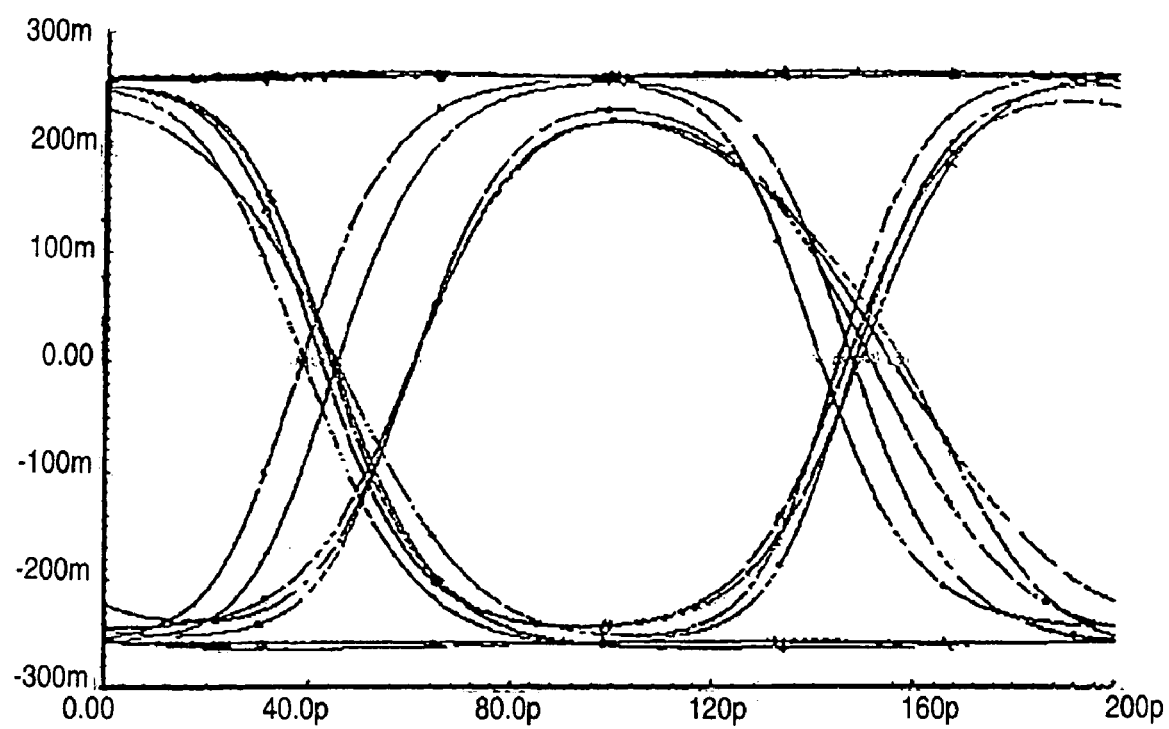
FIG. 13 illustrates an example of a waveform of a signal that has been amplified with the transimpedance amplifier having the optical distortion adjustment circuit of FIG. 1 and FIG. 2.

FIG. 13 illustrates an example of a waveform of a signal that has been amplified with the transimpedance amplifier having the optical distortion adjustment circuit of FIG. 1 or FIG. 2. The data that had been adjusted with the distortion adjustment circuit of FIGS. 1 and 2 shows reduced jitter at the two zero crossings, denoted with dotted lines.

Figure 14:
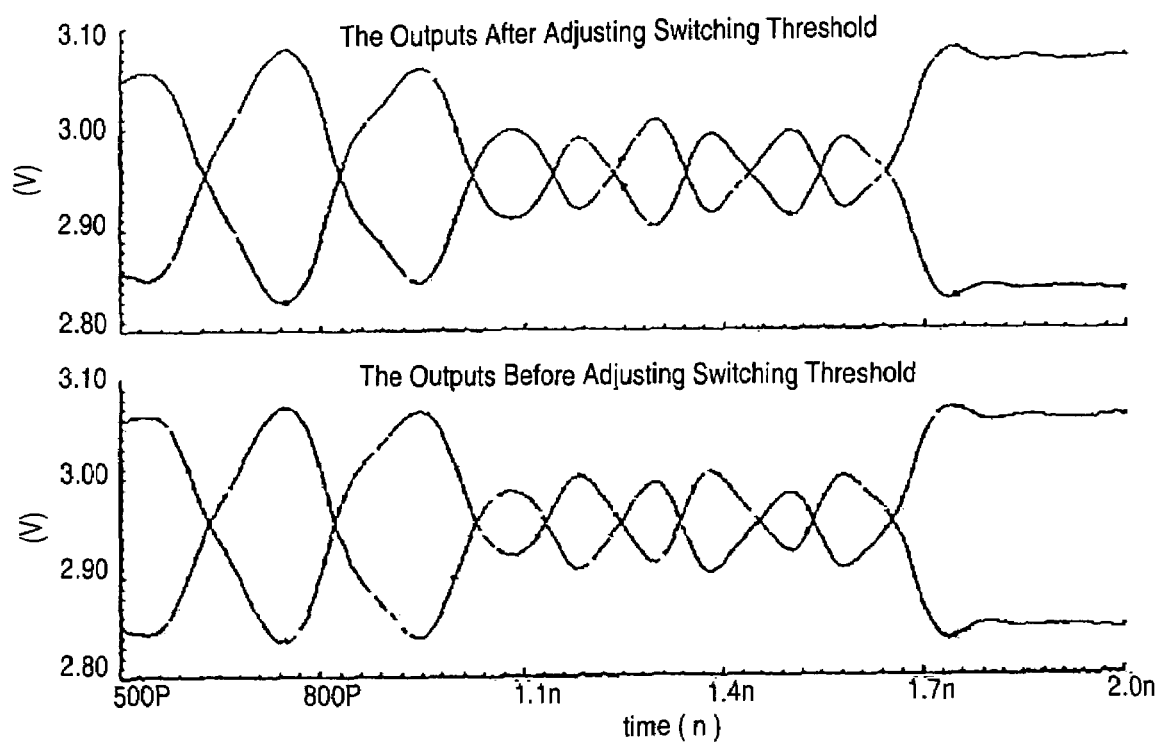
FIG. 14 illustrates a comparison of data before the optical distortion adjustment and after the optical distortion adjustment with the optical distortion adjustment circuit of FIGS. 1 and 2.

FIG. 14 illustrates a comparison of data before the optical distortion adjustment and after the optical distortion adjustment with the optical distortion adjustment circuit of FIG. 1 or 2. The waveform on the top illustrates the data output after adjusting the switching threshold with the adjustment circuit of FIG. 1 or 2. The waveform at the bottom illustrates the data output before the adjustment of the switching threshold. The top waveform shows the switching threshold adjustment increases or decreases the widths of the pulses to reduce overall jitter.

Figure 15:
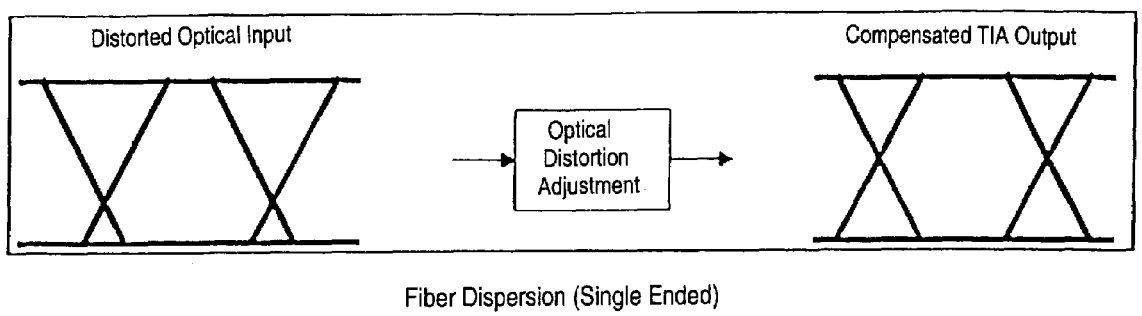
FIG. 15 illustrates an application of the optical distortion adjustment circuit of FIGS. 1 and 2 with distorted input signals.
Figure 16:
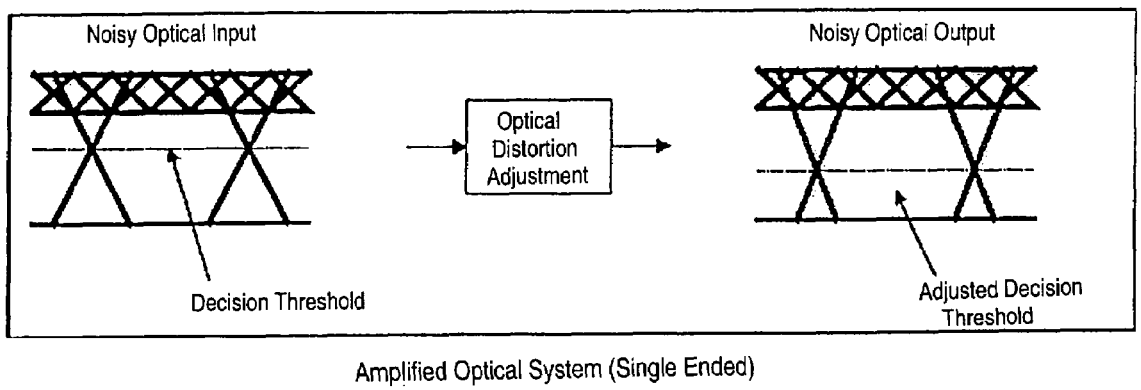
FIG. 16 illustrates an application of the optical distortion adjustment circuit of FIGS. 1 and 2 with noisy input signals.

Optical communication systems can have several types of impairments that can degrade system performance. These may include dispersion due to long spans of fiber and noise introduced by an amplified optical system. The design of receivers in these optical systems may require special compensation techniques to optimize the bit-error-rate. The circuits described in FIGS. 1-8 provide an optional control function to adjust for distorted input signals. As such, the capability to AC-couple the TIA to a transceiver device while optimizing receiver optical sensitivity is provided. FIGS. 15 and 16 illustrate two applications of this function.

FIG. 15 illustrates an application of the optical distortion adjustment circuit of FIG. 1 or 2 to distorted input signals. As shown, the adjusted or compensated output signal is no longer distorted. FIG. 16 illustrates an application of the optical distortion adjustment circuit of FIGS. 1 and 2 to noisy input signals. As shown, for the noise optical signal, the decision threshold has been lowered by the optical distortion.

Optical sensitivity can be determined from the input-referred RMS noise current IN as shown in the following formula. To improve the optical sensitivity, the signal-to-noise ratio and/or the input-referred RMS noise current IN need to be increased. In one embodiment, to achieve a bit-error-rate of 1E-12, the signal-to-noise ratio is 14:1.

$$S = 10\log\left(\frac{SNR}{2} \times \frac{I_N}{\rho} \times \frac{r_e}{r_e - 1} \times 1000\right) dBm$$

where:
S=sensitivity (dBm)
SNR=signal-to-noise current
$I_N$=Input-referred RMS noise current
$\rho$=photodiode responsivity in A/W
$r_e$=extinction ration Although the invention has been described with respect to certain embodiments, it should be recognized that the invention includes the claims and their equivalents supported by this disclosure.

What is claimed is:

1. A transimpedance amplifier having adjustment for optical distortion, the transimpedance amplifier comprising:
   a transimpedance stage;
   a post amplifier stage coupled to the transimpedance stage, the post amplifier stage comprising a plurality of post amplifiers coupled in series; and
   the post amplifier stage having a feedback path including an optical distortion adjustment circuit;
   wherein the optical distortion adjustment circuit comprises a differential voltage balance circuit and a feedback buffer.

2. The transimpedance amplifier of claim 1, wherein the differential voltage balance circuit comprises a plurality of variable current sources modifying a switching threshold of the post amplifier stage.

3. The transimpedance amplifier of claim 2, wherein the plurality of variable current sources are programmable.

4. The transimpedance amplifier of claim 2, wherein the plurality of variable current sources are manually controlled.

5. The transimpedance amplifier of claim 2, wherein each of the variable current sources comprises:
   an external resistor;
   a bandgap circuit;
   a first current mirror;
   a feedback current mirror coupled to the first current mirror; and
   a transistor coupling the external resistor, the bandgap circuit and the first current mirror.

6. The transimpedance amplifier of claim 5, wherein the feedback current mirror is driven by the first current mirror.

7. The transimpedance amplifier of claim 5, wherein the feedback current mirror is coupled to the feedback path.

* * * * *